United States Patent
Lee

(10) Patent No.: US 7,429,756 B2
(45) Date of Patent: Sep. 30, 2008

(54) NITRIDE SEMICONDUCTOR LIGHT EMITTING DEVICE

(75) Inventor: Suk-Hun Lee, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 297 days.

(21) Appl. No.: 10/564,404

(22) PCT Filed: Oct. 13, 2004

(86) PCT No.: PCT/KR2004/002606

§ 371 (c)(1),
(2), (4) Date: Jan. 13, 2006

(87) PCT Pub. No.: WO2005/038937

PCT Pub. Date: Apr. 28, 2005

(65) Prior Publication Data

US 2006/0192195 A1    Aug. 31, 2006

(30) Foreign Application Priority Data

Oct. 15, 2003    (KR) .................. 10-2003-0071633

(51) Int. Cl.
*H01L 27/15* (2006.01)
(52) U.S. Cl. .................. 257/96; 257/103; 257/85; 257/E33.008; 257/E33.028
(58) Field of Classification Search .................. 257/14, 257/94, 103, 96, 97, 77, 85, 79, E33.008, 257/E33.028
See application file for complete search history.

(56) References Cited

U.S. PATENT DOCUMENTS

| | | | |
|---|---|---|---|
| 5,929,466 A | 7/1999 | Ohba et al. | |
| 6,015,979 A * | 1/2000 | Sugiura et al. | ............. 257/86 |
| 6,201,262 B1 * | 3/2001 | Edmond et al. | ............. 257/77 |
| 6,657,234 B1 * | 12/2003 | Tanizawa | ............. 257/79 |
| 6,906,352 B2 * | 6/2005 | Edmond et al. | ............. 257/94 |
| 2002/0195606 A1 | 12/2002 | Edmond et al. | |

FOREIGN PATENT DOCUMENTS

| | | |
|---|---|---|
| DE | 102 13 395 A1 | 10/2002 |
| JP | 8-264894 A | 10/1996 |
| JP | 9-232629 A | 9/1997 |
| JP | 02002016284 A * | 1/2002 |
| KR | 2002-79659 A | 10/2002 |

(Continued)

*Primary Examiner*—A. Sefer
*Assistant Examiner*—Scott R Wilson
(74) *Attorney, Agent, or Firm*—Birch, Stewart, Kolasch & Birch, LLP

(57) ABSTRACT

A nitride semiconductor light emitting device is provided. The nitride semiconductor light emitting device includes: an n-type nitride semiconductor layer; an In-containing super lattice structure layer formed above the n-type nitride semiconductor layer; a first electrode contact layer formed above the super lattice structure layer; a first cluster layer formed above the first electrode contact layer; a first In-containing nitride gallium layer formed above the first cluster layer; a second cluster layer formed above the first In-containing nitride gallium layer; an active layer formed above the second cluster layer, for emitting light; a p-type nitride semiconductor layer formed above the active layer; and a second electrode contact layer formed above the p-type nitride semiconductor layer.

38 Claims, 3 Drawing Sheets

FOREIGN PATENT DOCUMENTS

| | | |
|---|---|---|
| KR | 2002-0079659 A | 10/2002 |
| KR | 2004-42311 A | 5/2004 |
| WO | WO-98/31055 A1 | 7/1998 |
| WO | WO-02/103814 A1 | 12/2002 |
| WO | WO-2004/114421 A1 | 12/2004 |

* cited by examiner

NITRIDE SEMICONDUCTOR LIGHT EMITTING DEVICE

TECHNICAL FIELD

The present invention relates to a nitride semiconductor, and more particularly, to a nitride semiconductor light emitting device for improving a light output and a reliability.

BACKGROUND ART

Generally, a GaN-based nitride semiconductor is being applied to an optic device such as a blue/green LED, and an electronic device having a characteristic of a high speed switching and high outputting in its application field, such as Metal Semiconductor Field Effect Transistor (MESFET) and High Electron Mobility Transistor (HEMT). Specifically, the blue/green LED is in mass-production, and its worldwide sale is being exponentially increased. Such a GaN-based nitride semiconductor light emitting device is mainly grown on a sapphire substrate or a SiC substrate. Additionally, a polycrystalline thin film of an $Al_yGa_{1-y}N$ layer is grown as a buffer layer on the sapphire substrate or the SiC substrate at a low growth temperature. After that, an undoped GaN layer, a Si-doped n-GaN layer or a combination thereof is grown on the buffer layer at a high temperature to manufacture the nitride semiconductor light emitting device having an n-GaN layer functioning as a first electrode contact layer and a magnesium-doped p-GaN layer, which is formed over the first electrode contact layer to function as a second electrode contact layer. Further, a light emitting layer is a PN junction diode having a sandwich structure in which an active layer with a multi quantum well structure is interposed between the first electrode contact layer and the second electrode contact layer.

However, the above-constructed nitride semiconductor light emitting device has a drawback in that a very high crystal defect of about $10^8$ cm$^3$ is generated at an interface of the substrate and the buffer layer and accordingly, an electric characteristic of the nitride semiconductor light emitting device, specifically, a current leakage is increased under a reverse bias condition, thereby having a critical influence on a device reliability.

Further, the nitride semiconductor light emitting device has a disadvantage in that it is not applicable due to a low luminance to a large screen device requiring a high luminance. Therefore, a solution for improving the reliability of the light emitting device and increasing the luminance is being continuously studied.

DISCLOSURE

Technical Problem

Accordingly, the present invention is directed to a nitride semiconductor light emitting device and a method of manufacturing the same that substantially obviate one or more of the problems due to limitations and disadvantages of the related art.

An object of the present invention is to provide a nitride semiconductor light emitting device and a method of manufacturing the same in which an active layer can have an improved crystallinity, and an improved light output and reliability.

Technical Solution

To achieve these and other advantages and in accordance with the purpose of the present invention, as embodied and broadly described, there is provided a nitride semiconductor light emitting device including: an n-type nitride semiconductor layer; an In-containing super lattice structure layer formed above the n-type nitride semiconductor layer; a first electrode contact layer formed above the super lattice structure layer; a first cluster layer formed above the first electrode contact layer; a first In-containing nitride gallium layer formed above the first cluster layer; a second cluster layer formed above the first In-containing nitride gallium layer; an active layer formed above the second cluster layer, for emitting light; a p-type nitride semiconductor layer formed above the active layer; and a second electrode contact layer formed above the p-type nitride semiconductor layer.

In another aspect of the present invention, there is provided a nitride semiconductor light emitting device including: a first electrode contact layer; a first cluster layer formed above the first electrode contact layer; a first In-containing nitride gallium layer formed above the first cluster layer; a second cluster layer formed above the first In-containing nitride gallium layer; an active layer formed above the second cluster layer; and a p-type nitride semiconductor layer formed above the active layer.

In a further aspect of the present invention, there is provided a nitride semiconductor light emitting device including: an n-type first electrode contact layer; a first $SiN_a$ cluster layer formed above the first electrode contact layer; a first In-containing nitride gallium layer formed above the first $SiN_a$ cluster layer; a second $SiN_a$ cluster layer formed above the first In-containing nitride gallium layer; an active layer formed above the second $SiN_a$ cluster layer, for emitting light; a p-type nitride gallium layer formed above the active layer; and an n-type second electrode contact layer formed above the p-type nitride gallium layer.

In a further another aspect of the present invention, there is provided a nitride semiconductor light emitting device including: an n-type first electrode contact layer; a strain control layer formed over the first electrode contact layer; an active layer formed over the strain control layer, for emitting light, to have an $In_yGa_{1-y}N$ well layer, a $SiN_a$ cluster layer having a thickness of atomic scale, and an $In_zGa_{1-z}N$ barrier layer; a p-type nitride gallium layer formed above the active layer; and an n-type second electrode contact layer formed above the p-type nitride gallium layer.

In a still another aspect of the present invention, there is provided a nitride semiconductor light emitting device including: an n-type first electrode contact layer; a strain control layer formed over the first electrode contact layer; an active layer formed over the strain control layer; a $SiN_a$ cluster layer formed above the active layer; a p-type nitride semiconductor layer formed above the $SiN_a$ cluster layer; and an n-type second electrode contact layer formed above the p-type nitride semiconductor layer.

In a still another aspect of the present invention, there is provided a nitride semiconductor light emitting device including: an n-type first electrode contact layer; a strain control layer formed over the first electrode contact layer; an active layer formed over the strain control layer to have a first quantum well layer, a second quantum well layer, and an $In_xGa_{1-x}N$ layer interposed between the first quantum well layer and the second quantum well layer; a p-type nitride semiconductor layer formed above the active layer; and an n-type second electrode contact layer formed above the p-type nitride semiconductor layer.

In a still another aspect of the present invention, there is provided a nitride semiconductor light emitting device including: an n-type first electrode contact layer; an active layer formed over the first electrode contact layer, for emitting light; a p-type nitride semiconductor layer formed above the active layer; and an n-type second electrode contact layer formed above the p-type nitride semiconductor layer to have an $In_xGa_{1-x}N/In_yGa_{1-y}N$ super lattice structure.

Advantageous Effects

The nitride semiconductor light emitting device and the method of manufacturing the same have an advantage in that the light emitting layer of the nitride semiconductor light emitting device can have an improved crystallinity, and the improved light output and reliability.

BEST MODE

Hereinafter, preferred embodiments of the present invention will be described in detail with reference to accompanying drawings.

First Embodiment

Figure 1:
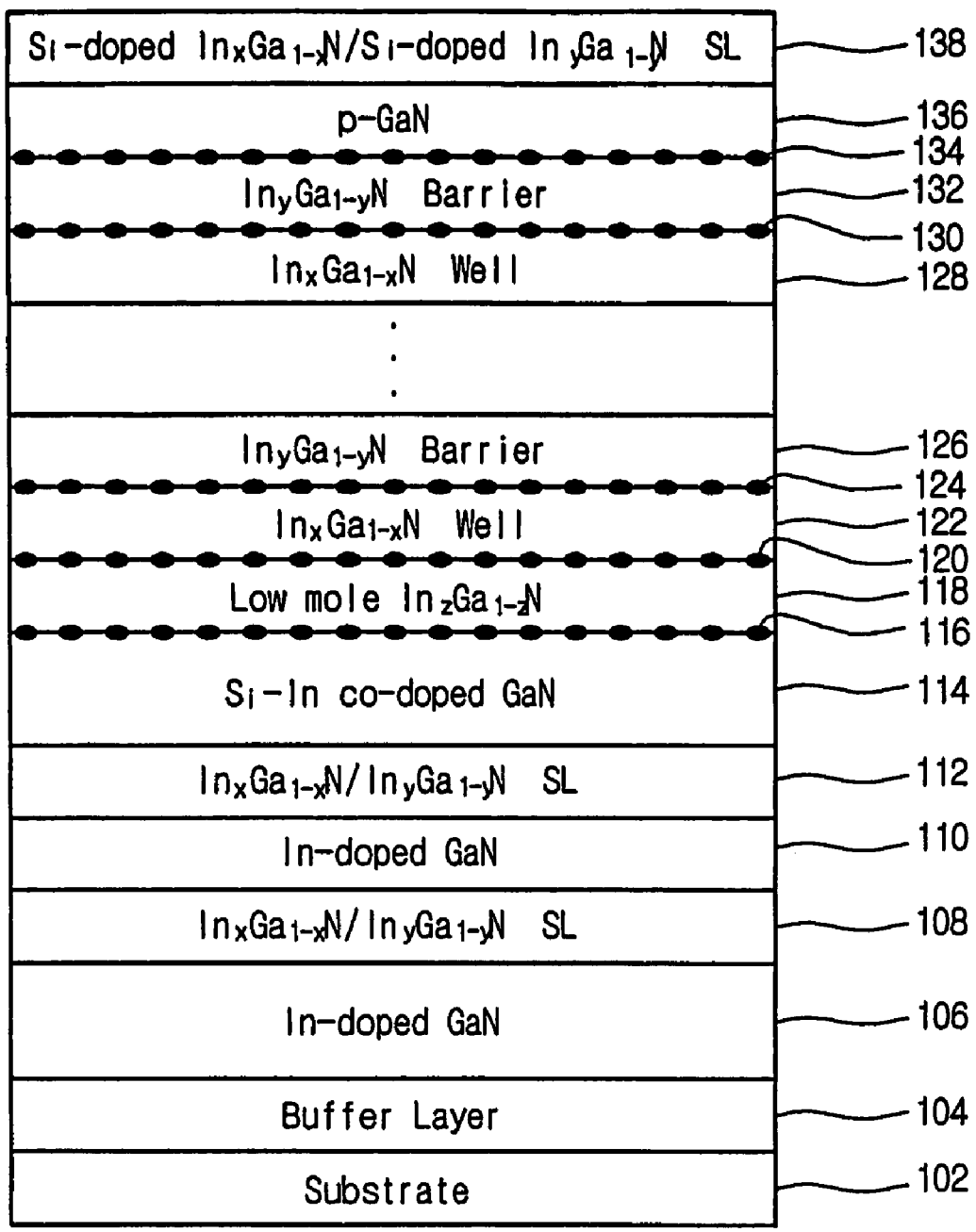
FIG. 1 is a view illustrating a layer structure of a nitride semiconductor light emitting device according to a first embodiment of the present invention.

FIG. 1 is a view illustrating a layer structure of a nitride semiconductor light emitting device according to a first embodiment of the present invention.

Referring to FIG. 1, the nitride semiconductor light emitting device according to the present invention has a buffer layer 104 formed on a substrate 102. Here, the buffer layer 104 can be formed to have an AlInN structure, an InGaN/GaN super lattice structure, an $In_zGa_{1-x}N/GaN$ layered structure, an $Al_xIn_yGa_{1-x-y}N/In_zGa_{1-z}N/GaN$ layered structure or an AlInN/GaN layered structure. Additionally, an In-doped GaN layer 106 is formed on the buffer layer 104, and an $In_xGa_{1-x}N/In_yGa_{1-y}N$ super lattice structure layer 108 is formed on the In-doped GaN layer 106. Further, an In-doped GaN layer 110 is formed on the $In_xGa_{1-x}N/In_yGa_{1-y}N$ super lattice structure layer 108, and an $In_xGa_{1-x}N/In_yGa_{1-y}N$ super lattice structure layer 112 is additionally formed on the In-doped GaN layer 110. Here, the In-doped GaN layer and the $In_xGa_{1-x}N/In_yGa_{1-y}N$ super lattice structure layer can be also additionally formed repeatedly and in plurality.

Additionally, an n-type first electrode contact layer is provided on the $In_xGa_{1-x}N/In_yGa_{1-y}N$ super lattice structure layer 112. The present invention employs a Si—In co-doped GaN layer 114 as the first electrode contact layer. The co-doping of silicon and indium can cause a low contact resistance, and can suppress the reduction of the crystallinity depending on the increase of a doped amount of silicon.

Additionally, a first $SiN_a$ cluster layer 116 ("a" denotes any value exceeding zero, and it is the same hereinafter) is formed on the Si—In co-doped GaN layer 114, and a first $In_zGa_{1-z}N$ layer 118 containing a less doped indium on the first $SiN_a$ cluster layer 116. A second $SiN_a$ cluster layer 120 is again formed on the first $In_zGa_{1-z}N$ layer 118. At this time, the first $SiN_a$ cluster layer 116 and the second $SiN_a$ cluster layer 120 are formed to have thicknesses of atomic scale.

An active layer is formed on the second $SiN_a$ cluster layer 120 to emit light. In the present invention, the active layer is formed to have a single quantum well structure or a multi quantum well structure, which is comprised of $In_xGa_{1-x}N$ well layer/$In_yGa_{1-y}N$ barrier layer. The $SiN_a$ cluster layer is respectively formed between the $In_xGa_{1-x}N$ well layer 122 and the $In_yGa_{1-y}N$ barrier layer 126.

In other words, the active layer can be formed to have the single quantum well structure, which is comprised of $In_xGa_{1-x}N$ well layer/$SiN_a$ cluster layer/$In_yGa_{1-y}N$ barrier layer 122, 124 and 126. Additionally, the multi quantum well structure having $In_xGa_{1-x}N$ well layer/$SiN_a$ cluster layer/$In_yGa_{1-y}N$ barrier layer 128, 130 and 132 can be also formed over the quantum well structure having the $In_xGa_{1-x}N$ well layer/$SiN_q$ cluster layer/$In_yGa_{1-y}N$ barrier layer 122, 124 and 126. Detailed composition ratios of the well layer, the cluster layer and the barrier layer can be also different at each of layer.

Further, a p-GaN layer 136 is formed on the above-structured active layer, and an n-type second electrode contact layer is formed on the p-GaN layer 136. In the present invention, the second electrode contact layer is formed to have a silicon-doped $In_xGa_{1-x}N/In_yGa_{1-y}N$ super lattice structure layer, an $In_xGa_{1-x}N$ layer of a super grading structure where an indium composition is varied to control an energy band gap, or an ($In_xGa_{1-x}N/In_yGa_{1-y}N$ super lattice)/n-GaN layered structure layer. Further, a $SiN_a$ cluster layer 134 is additionally formed between the active layer and the p-GaN layer 136. At this time, the $SiN_a$ cluster layer 134 is formed to have a thickness of atomic scale.

The above-described nitride semiconductor light emitting device has an n-/p-/n-junction. The n-/p-/n-junction includes the Si—In co-doped GaN layer 114 functioning as the first electrode contact layer and the Si-doped n-$In_xGa_{1-x}N$/$In_yGa_{1-y}N$ super lattice structure layer 138 functioning as the second electrode contact layer. Here, electrodes (not shown) are respectively formed using the first electrode contact layer and the second electrode contact layer in a sequential process, and a voltage is applied through the electrodes.

Further, in order to improve a light output and a reliability of the nitride semiconductor light emitting device, before the active layer is grown, the $SiN_a$ cluster layers 116 and 120 of atomic scale are grown before and after the low-mole $In_zGa_{1-z}N$ layer 118 is grown to have a low indium content ($SiN_a$/low-mole $In_xGa_{1-x}N/SiN_a$). The above-construction allows the low-mole $In_zGa_{1-z}N$ layer 118 to control a strain of the active layer, and allows an internal quantum efficiency of the active layer to be improved. Further, the $SiN_a$ cluster layers 116 and 120 can allow a precise control of the strain.

Furthermore, even when the active layer is formed, the $SiN_q$ cluster layers 124 and 130 are again interposed between the $In_xGa_{1-x}N$ well layers 122 and 128 and the $In_yGa_{1-y}N$ barrier layers 126 and 132 in the same way ($In_xGa_{1-x}N/SiN_a$/$In_yGa_{1-y}N$). By interposing the $SiN_a$ cluster layers 124 and 130, the internal quantum efficiency of the active layer can be improved.

Further, in order to suppress an in-diffusion of magnesium from a magnesium doped P-GaN layer 136 to the active layer, the $SiN_a$ cluster layer 134 of atomic scale is formed after the last $In_xGa_{1-x}N$ barrier layer 132 is grown. Therefore, a drawback of a high contact resistance caused by a low magnesium doping efficiency of the p-GaN layer 136 used as a conventional second electrode layer, and a drawback of a reliability caused by its following current crowding generated at a circumference of the electrode can be perfectly solved by using an n-$In_xGa_{1-x}N/In_yGa_{1-y}N$ super lattice structure layer as the second electrode contact layer. In other words, current spreading is effectively performed due to an $n^+$-layer to regularize an operation voltage and accordingly effectively increase a length of life of the light emitting device. Specifically, such a structure of the light emitting device having the n-/p-/n-junction has an advantage in that it can effectively correspond to a large area and large output light emitting device generating much heat.

In order to improve the internal quantum efficiency and increase the light output, the present invention forms the low-mole $In_zGa_{1-z}N$ layer 118 with the low indium content to control the strain of the active layer. Further, in order to improve the light output and a reverse leakage current caused by indium fluctuation, the $SiN_a$ cluster layers 116 and 120 are formed to have the thicknesses of atomic scale before and after the growth of the low-mole $In_xGa_{1-x}N$ layer 118. Through the above process, a strain control layer having the $SiN_a$ cluster layer 116/low-mole $In_xGa_{1-x}N$ 118/$SiN_a$ cluster layer 120 is grown.

Additionally, after the strain control layer is grown, the active layer emitting a desired wavelength of light has the single quantum well or the multi quantum well having the $In_xGa_{1-x}N$ well layer/$SiN_a$ cluster layer/$In_yGa_{1-y}N$ barrier layer as one unit structure.

Here, each of indium contents of the well layer and the barrier layer is as follows: $In_xGa_{1-x}N$ ($0<x<0.35$)/$SiN_a$/$In_yGa_{1-y}N$ ($0<y<0.1$). Additionally, the active layer having the quantum well structure is grown using TMGa, TMIn, $SiH_4$ and $Si_2H_6$ sources in an atmosphere of $N_2$, $H_2+N_2$ carrier gas and $NH_3$.

Further, the low-mole $In_zGa_{1-z}N$ layer 118 can have the indium content of $0<x<0.1$. Additionally, the low-mole $In_zGa_{1-z}N$ layer 118 is formed to have a thickness of 10-300 Å, and the well layer and the barrier layer respectively are formed to have thicknesses of 10-30 Å and 50-250 Å at a growth temperature of 730-770° C. At this time, the low-mole $In_zGa_{1-z}N$ layer 118 is controlled to allow its surface shape to be grown in a spiral mode, and the grown spiral mode is controlled and connected up to a surface of the active layer. Additionally, the $SiN_a$ cluster layers 124 and 130 interposed between the well layer and the barrier layer are controlled in an atomic scale, and their characteristics can be controlled using a flow of $SiH_4$, $Si_2H_6$ and $NH_3$ for a predetermined time.

After the growth of the active layer having the structure of the $SiN_a$ cluster layer/low-mole $In_xGa_{1-x}N$ layer/$SiN_a$ cluster layer/well layer/$SiN_a$ cluster layer/barrier layer/$SiN_a$ cluster layer, the growth temperature is increased to grow the magnesium-doped p-GaN layer 136 in a gas atmosphere of $H_2$, $N_2$, $H_2+N_2$ and $NH_3$.

At this time, the p-GaN layer 136 is doped with magnesium to have a plurality of layers in which a doped amount of magnesium is sequentially increased. In a preferred example, the p-GaN layer 136 has a three-layered structure in which the doped amount of magnesium is sequentially increased. The p-GaN layer 136 has a thickness of 500-2500 Å and a growth temperature of 900-1020° C.

After the p-GaN layer 136 is grown, the n-$In_xGa_{1-x}N/In_yGa_{1-y}N$ super lattice structure layer 138 is grown on the p-GaN layer 136. Silicon is excessively doped only into the $In_yGa_{1-y}N$ layer ($0<y<0.1$) having the low indium content to reduce the contact resistance, thereby providing the tunneling effect by controlling a total thickness. Accordingly, the n-$In_xGa_{1-x}N/In_yGa_{1-y}N$ (Si) super lattice structure layer 138 is used as the second electrode contact layer and effectively performs the current spreading. Here, the n-$In_xGa_{1-x}N/In_yGa_{1-y}N$ super lattice structure layer 138 is constructed to respectively and alternately have a thickness of 2-50 Å and a thickness of less than 200Å to the maximum.

Accordingly, the light emitting device can be manufactured to have a high luminance and an excellent reliability of the n-/p-/n-junction structure.

In the above embodiment, subscripts such as "x", "y", "z" and "n" are mixed and used in each of the layers, but such limitations of the subscripts are applied only to a corresponding layer. The subscript limiting the composition ratio of any one layer limits independent composition ratios of other layers. This is the same as in a below second embodiment of the present invention.

Second Embodiment

Figure 2:
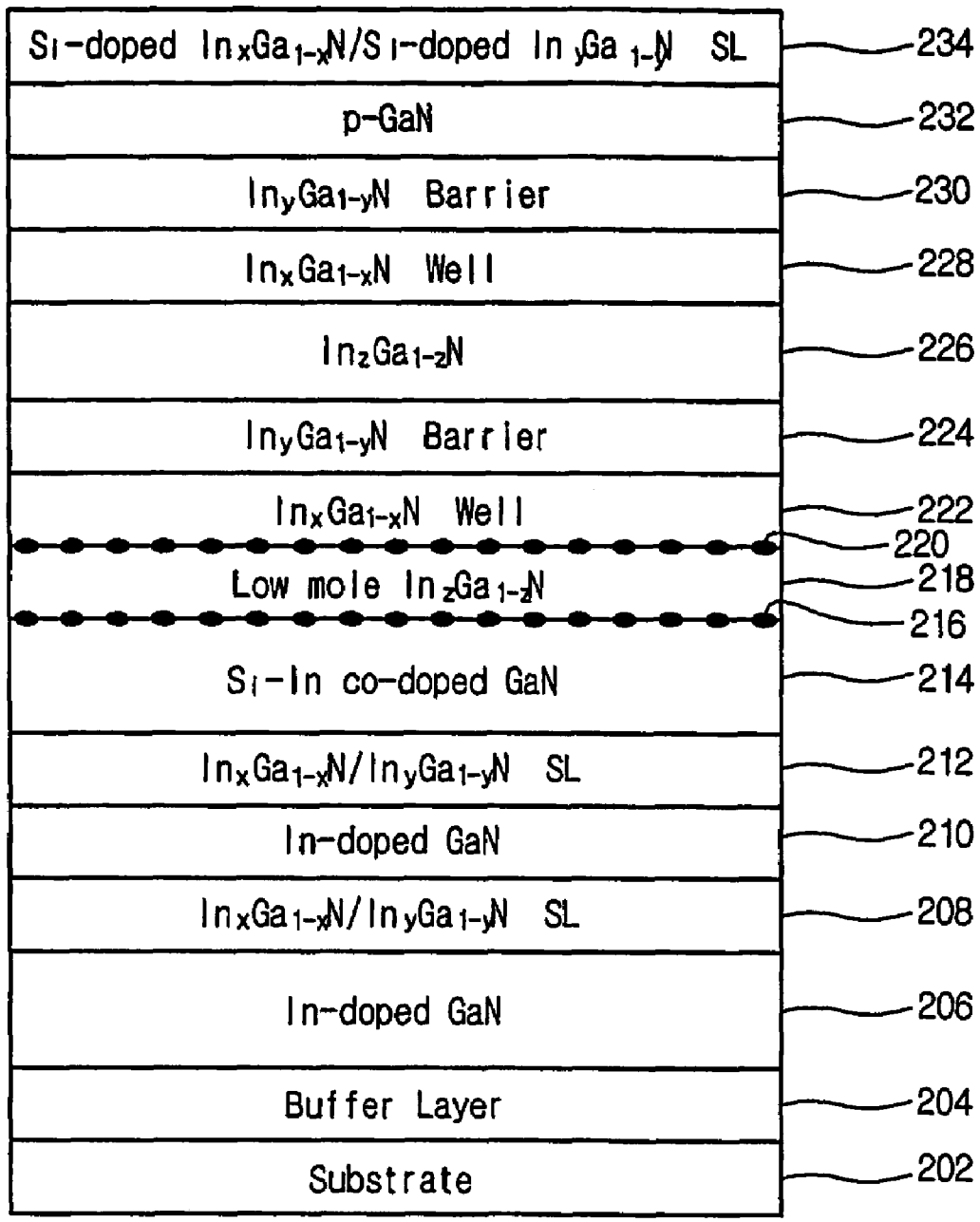
FIG. 2 is a view illustrating a layer structure of a nitride semiconductor light emitting device according to a second embodiment of the present invention.

FIG. 2 is a view illustrating a layer structure of a nitride semiconductor light emitting device according to a second embodiment of the present invention.

In the second embodiment, an $In_xGa_{1-x}N$ layer having a low doped indium content is additionally formed between a pair of quantum well layers, which are comprised of a well layer and a barrier layer, so that a strain characteristic of the quantum well layer formed on the InxGa1-xN layer is controlled to effectively improve a reverse breakdown voltage and increase the light output, thereby improving a reliability of the light emitting device.

As shown in FIG. 2, the nitride semiconductor light emitting device according to the second embodiment of the present invention has a buffer layer 204 formed on a substrate 202. Here, the buffer layer 204 can be formed to have an AlInN structure, an AlInN/GaN layered structure, an InGaN/GaN super lattice structure, an $In_xGa_{1-x}N$/GaN layered structure, or an $Al_xIn_yGa_{1-x-y}N/In_yGa_{1-x}N$/GaN layered structure.

Additionally, an In-doped GaN layer 206 is formed on the buffer layer 204, and an $In_xGa_{1-x}N/In_yGa_{1-y}N$ super lattice structure layer 208 is formed on the In-doped GaN layer 206. Further, an In-doped GaN layer 210 is formed on the $In_xGa_{1-x}N/In_yGa_{1-y}N$ super lattice structure layer 208, and an $In_xGa_{1-x}N/In_yGa_{1-y}N$ super lattice structure layer 212 is additionally formed on the In-doped GaN layer 210. Here, the In-doped GaN layer and the $In_xGa_{1-x}N/In_yGa_{1-y}N$ super lattice structure layer can be also additionally formed repeatedly and in plurality.

Additionally, an n-type first electrode contact layer is provided on the $In_xGa_{1-x}N/In_yGa_{1-y}N$ super lattice structure layer 212. The present invention employs a Si—In co-doped GaN layer 214 as the first electrode contact layer.

Additionally, a first $SiN_a$ cluster layer 216 is formed on the Si—In co-doped GaN layer 214, and a first $In_zGa_{1-z}N$ layer 218 containing a less doped indium on the first $SiN_a$ cluster layer 216. A second $SiN_a$ cluster layer 220 is again formed on the first $In_zGa_{1-z}N$ layer 218. At this time, the low-mole $In_zGa_{1-z}N$ layer 218 is controlled to allow its surface shape to be grown in a spiral mode, and the first $SiN_a$ cluster layer 216 and the second $SiN_a$ cluster layer 220 are formed to have a thickness of atomic scale.

A first quantum well layer is formed on the second $SiN_a$ cluster layer 220 to have a structure of $In_xGa_{1-x}N$ well layer/$In_yGa_{1-y}N$ barrier layer 222 and 224. Further, an $In_zGa_{1-z}N$ layer 226 having a low doped indium content is formed on the first quantum well layer, and a multi quantum well layer is formed on the $In_zGa_{1-z}N$ layer 226 to have a structure of at least one of $In_xGa_{1-x}N$ well layer 228/$In_yGa_{1-y}N$ barrier layer 230.

Here, the $In_zGa_{1-z}N$ layer 226 having the low doped indium content is grown to have a thickness of 300-2000 Å. The light emitting device controls the strain of the single quantum well layer or the Multi Quantum Well (MQW) layer, which is formed on the $In_zGa_{1-z}N$ layer 226, to effectively suppress the light output and the reverse leakage current. At this time, the doped indium content of the $In_zGa_{1-z}N$ layer 226 is lower than the doped indium content of the barrier layer.

Figure 3:
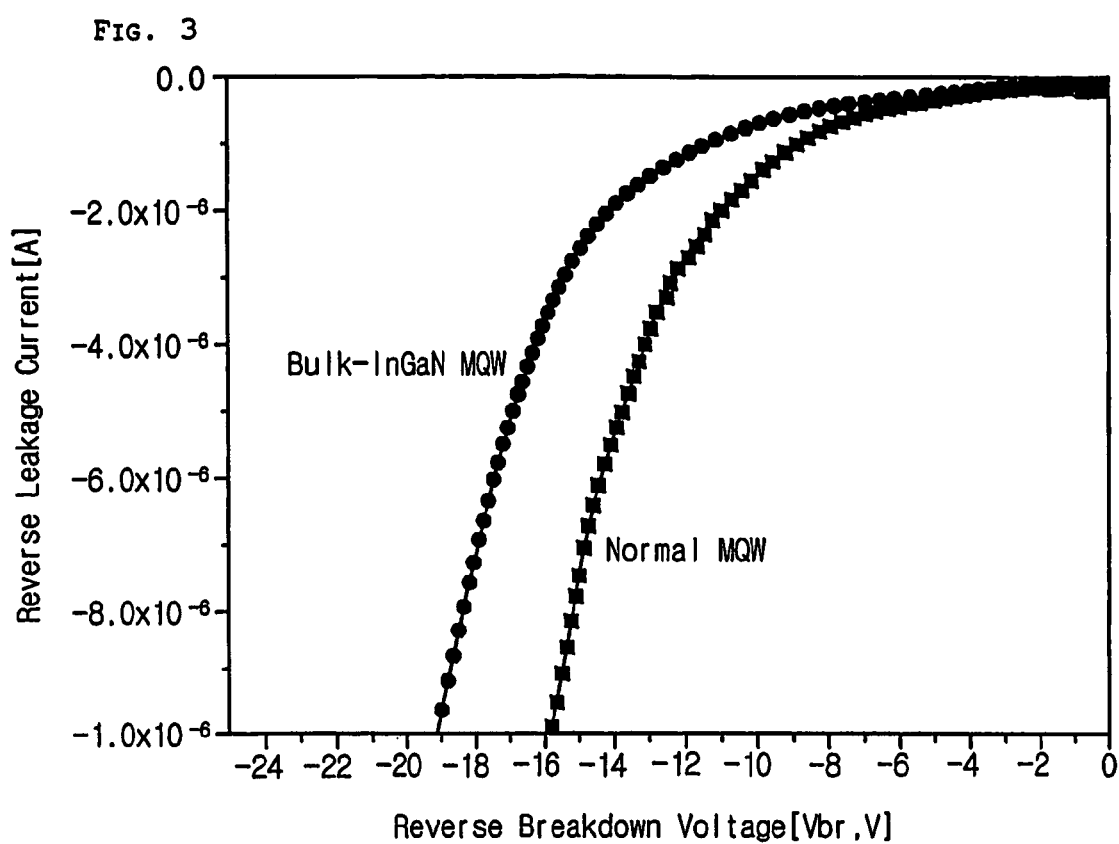
FIG. 3 is a view illustrating a current characteristic of a nitride semiconductor light emitting device according to the present invention.

FIG. 3 illustrates a variation of the reverse breakdown voltage in case where a bulk-InGaN MQW layer is grown to have the $In_zGa_{1-z}N$ layer 226, and in case where the multi quantum well layer is grown not to have the $In_zGa_{1-z}N$ layer 226.

Referring to FIG. 3, in case where the Bulk-InGaN MQW layer with the $In_zGa_{1-z}N$ layer 226 is formed, the reverse breakdown voltage is improved to increase the reliability of the light emitting device in comparison to a normal MQW layer.

Further, a p-GaN layer 232 is formed on the above-constructed active layer, and an n-type second electrode contact layer 234 is formed on the p-GaN layer 232. A silicon doped $In_xGa_{1-x}N/In_yGa_{1-y}N$ super lattice structure layer is formed as the second electrode contact layer.

The nitride semiconductor light emitting device according to the present invention can be formed to have the n-/p-/n-junction. The n-/p-/n-junction has the Si—In co-doped GaN layer 214 functioning as the first electrode contact layer and the $In_xGa_{1-x}N/In_yGa_{1-y}N$ (Si-doped) super lattice structure layer 234 functioning as the second electrode contact layer. Here, electrodes (not shown) are respectively formed using the first electrode layer and the second electrode contact layer in a sequential process, and the voltage is applied through the electrodes.

A manufacturing method of the nitride semiconductor light emitting device according to the present invention is similar with the manufacturing method described with reference to FIG. 1, and a detailed description thereof is omitted.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

INDUSTRIAL APPLICABILITY

The present invention is applicable to a large-screen display device by increasing the luminance of the light emitting device.

The invention claimed is:

1. A nitride semiconductor light emitting device comprising:
   an n-type nitride semiconductor layer;
   an In-containing super lattice structure layer formed above the n-type nitride semiconductor layer;
   a first electrode contact layer formed above the super lattice structure layer;
   a first cluster layer formed above the first electrode contact layer;
   a first In-containing nitride gallium layer formed above the first cluster layer;
   a second cluster layer formed above the first In-containing nitride gallium layer;
   an active layer formed above the second cluster layer;
   a p-type nitride semiconductor layer formed above the active layer; and
   a second electrode contact layer formed above the p-type nitride semiconductor layer.

2. The device according to claim 1, wherein the active layer comprises:
   a first quantum well layer having an $In_yGa_{1-y}N$ well layer/$In_zGa_{1-z}N$ barrier layer structure;
   a second In-containing nitride gallium layer formed above the first quantum well layer; and
   a second quantum well layer formed above the second In-containing nitride gallium layer to have an $In_yGa_{1-y}N$ well layer/$In_zGa_{1-z}N$ barrier layer structure.

3. The device according to claim 2, wherein the second In-containing nitride gallium layer has a chemical formula of $In_xGa_{1-x}N$ (0<x<0.1), and has a thickness of 300-2000 Å.

4. The device according to claim 1, further comprising a buffer layer formed below the n-type nitride semiconductor layer, and a substrate formed below the buffer layer.

5. The device according to claim 4, wherein the buffer layer has one selected from an AlInN structure, an AlInN/GaN layered structure, an InGaN/GaN super lattice structure, an $In_xGa_{1-x}N/GaN$ layered structure, and an $Al_xIn_yGa_{1-x-y}N/In_zGa_{1-z}N/GaN$ layered structure.

6. The device according to claim 1, wherein the n-type nitride semiconductor layer is doped with indium (In).

7. The device according to claim 1, wherein the first electrode contact layer is a Si-In co-doped nitride gallium layer.

8. The device according to claim 1, wherein the first cluster layer and/or the second cluster layer are formed to have a thickness of atomic scale.

9. The device according to claim 1, wherein the cluster layers are formed of $SiN_a$.

10. The device according to claim 1, wherein the first In-containing nitride gallium layer has a surface shape grown in a spiral mode.

11. The device according to claim 1, wherein the first In-containing nitride gallium layer has a surface shape grown and connected up to a surface of the active layer.

12. The device according to claim 1, wherein the active layer has a single quantum well structure or a multi quantum well structure, which is has an $In_xGa_{1-x}N$ well layer/$In_yGa_{1-y}N$ barrier layer.

13. The device according to claim 12, wherein the InxGa1-xN well layer/InyGa1-yN barrier layer have indium contents of 0<x<0.35 and 0<y<0.1, respectively.

14. The device according to claim 12, further comprising a $SiN_a$ cluster layer formed between the $In_xGa_{1-x}N$ well layer and the $In_yGa_{1-y}N$ barrier layer of the active layer to have a thickness of atomic scale.

15. The device according to claim 14, wherein the $In_xGa_{1-x}N/In_yGa_{1-y}N$ layers of the second electrode contact layer have a total thickness of less than 200 Å.

16. The device according to claim 1, wherein the first In-containing nitride gallium layer is expressed as $In_xGa_{1-x}N$, and has a value of 1<x<0.1.

17. The device according to claim 1, further comprising a $SiN_a$ cluster layer formed between the active layer and the p-nitride semiconductor layer to have a thickness of atomic scale.

18. The device according to claim 1, wherein the second electrode contact layer is formed to have one selected from an $In_xGa_{1-x}N/In_yGa_{1-y}N$ super lattice structure, an $In_xGa_{1-x}N$ super grading structure and $(In_xGa_{1-x}N/In_yGa_{1-y}N$ super lattice)/n-GaN layered structure.

19. The device according to claim 18, wherein $In_xGa_{1-x}N/In_yGa_{1-y}N$ layers of the second electrode contact layer have a thickness of 2-50 Å, respectively and alternately.

20. The device according to claim 18, wherein the In-containing super lattice structure layer formed of $In_xGa_{1-x}N/In_yGa_{1-y}N$ is provided at least one.

21. The device according to claim 1, wherein the second electrode contact layer has a doped silicon.

22. The device according to claim 1, wherein the n-type nitride semiconductor layer and the In-containing super lattice structure formed above the n-type nitride semiconductor layer is repeatedly formed.

23. The device according to claim 1, wherein the p-type nitride semiconductor layer is formed to have a multi-layered structure in which a doped amount of magnesium is sequentially increased.

24. A nitride semiconductor light emitting device comprising:
a first electrode contact layer;
a first cluster layer formed above the first electrode contact layer;
a first In-containing nitride gallium layer formed above the first cluster layer;
a second cluster layer formed above the first In-containing nitride gallium layer;
an active layer formed above the second cluster layer; and
a p-type nitride semiconductor layer formed above the active layer.

25. The device according to claim 24, wherein the first and/or second cluster layers are/is formed of $SiN_a$.

26. The device according to claim 24, wherein the active layer comprises:
a first quantum well layer having an $In_yGa_{1-y}N$ well layer/$In_zGa_{1-z}N$ barrier layer structure;
a second In-containing nitride gallium layer formed above the first quantum well layer; and
a second quantum well layer formed above the second In-containing nitride gallium layer to have a structure of at least one of $In_yGa_{1-y}N$ well layer/$In_zGa_{1-z}N$ barrier layer.

27. The device according to claim 24, further comprising a second electrode contact layer formed above the p-type nitride semiconductor layer.

28. The device according to claim 27, wherein the second electrode contact layer has an In-containing super lattice structure.

29. The device according to claim 24, further comprising a Si-doped In-containing super lattice structure formed above the p-type nitride semiconductor layer.

30. The device according to claim 24, wherein the first electrode contact layer comprises:
an In-doped GaN layer;
an $In_xGa_{1-x}N/In_yGa_{1-y}N$ super lattice structure layer formed above the In-doped GaN layer; and
a Si-In co-doped GaN layer formed above the $In_xGa_{1-x}N/In_yGa_{1-y}N$ super lattice structure layer.

31. The device according to claim 24, wherein the active layer has a single quantum well structure or a multi quantum well structure, which has $In_yGa_{1-y}N$ well layer/$In_zGa_{1-z}N$ barrier layer.

32. The device according to claim 24, wherein the active layer is comprised of the $In_yGa_{1-y}N$ well layer and the $In_zGa_{1-z}N$ barrier layer, and a $SiN_a$ cluster layer interposed therebetween.

33. The device according to claim 24, further comprising a $SiN_a$ cluster layer formed between the active layer and the p-nitride semiconductor layer.

34. A nitride semiconductor light emitting device comprising:
an n-type first electrode contact layer;
a first $SiN_a$ cluster layer formed above the first electrode contact layer;
a first In-containing nitride gallium layer formed above the first $SiN_a$ cluster layer;
a second $SiN_a$ cluster layer formed above the first In-containing nitride gallium layer;
an active layer formed above the second $SiN_a$ cluster layer, for emitting light;
a p-type nitride gallium layer formed above the active layer; and
an n-type second electrode contact layer formed above the p-type nitride gallium layer.

35. A nitride semiconductor light emitting device comprising:
an n-type first electrode contact layer;
a strain control layer formed over the first electrode contact layer;
an active layer formed over the strain control layer, for emitting light, to have an $In_yGa_{1-y}N$ well layer, a $SiN_a$ cluster layer having a thickness of atomic scale, and an $In_zGa_{1-z}N$ barrier layer;
a p-type nitride gallium layer formed above the active layer; and
an n-type second electrode contact layer formed above the p-type nitride gallium layer.

36. A nitride semiconductor light emitting device comprising:
an n-type first electrode contact layer;
a strain control layer formed over the first electrode contact layer;
an active layer formed above the strain control layer;
a $SiN_a$ cluster layer formed above the active layer;
a p-type nitride semiconductor layer formed above the $SiN_a$ cluster layer; and
an n-type second electrode contact layer formed above the p-type nitride semiconductor layer.

37. A nitride semiconductor light emitting device comprising:
an n-type first electrode contact layer;
a strain control layer formed above the first electrode contact layer;
an active layer formed above the strain control layer to have a first quantum well layer, a second quantum well layer, and an $In_xGa_{1-x}N$ layer interposed between the first quantum well layer and the second quantum well layer;
a p-type nitride semiconductor layer formed above the active layer; and
an n-type second electrode contact layer formed above the p-type nitride semiconductor layer.

38. A nitride semiconductor light emitting device comprising:
an n-type first electrode contact layer;
an active layer formed above the first electrode contact layer, for emitting light;
a p-type nitride semiconductor layer formed above the active layer; and
an n-type second electrode contact layer formed above the p-type nitride semiconductor layer to have an $In_xGa_{1-x}N/In_yGa_{1-y}N$ super lattice structure.

* * * * *